US009712190B2

(12) United States Patent
Camp et al.

(10) Patent No.: US 9,712,190 B2
(45) Date of Patent: Jul. 18, 2017

(54) DATA PACKING FOR COMPRESSION-ENABLED STORAGE SYSTEMS

(71) Applicant: International Business Machines Corporation, Armonk, NY (US)

(72) Inventors: Charles J. Camp, Sugar Land, TX (US); Timothy J. Fisher, Cypress, TX (US); Thomas Mittelholzer, Zurich (CH); Nikolaos Papandreou, Thalwil (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/864,666

(22) Filed: Sep. 24, 2015

(65) Prior Publication Data

US 2017/0093440 A1    Mar. 30, 2017

(51) Int. Cl.
*G06F 3/06*     (2006.01)
*H03M 13/00*    (2006.01)
*G06F 11/10*    (2006.01)

(52) U.S. Cl.
CPC ........ *H03M 13/6312* (2013.01); *G06F 3/064* (2013.01); *G06F 3/0608* (2013.01); *G06F 3/0644* (2013.01); *G06F 3/0673* (2013.01); *G06F 11/1076* (2013.01)

(58) Field of Classification Search
CPC .. H03M 13/6312; G06F 3/0608; G06F 3/064; G06F 3/0644; G06F 3/0673; G06F 11/1076

USPC ......... 711/118, 154, 156; 345/555; 365/185.33; 710/68; 714/52
See application file for complete search history.

(56) References Cited

U.S. PATENT DOCUMENTS

| 5,386,531 A | 1/1995 | Blaner et al. |
|---|---|---|
| 6,105,109 A | 8/2000 | Krumm et al. |
| 6,128,623 A | 10/2000 | Mattis et al. |
| 6,467,021 B1 | 10/2002 | Sinclair |

(Continued)

FOREIGN PATENT DOCUMENTS

| CN | 101958720 A | 1/2011 |
|---|---|---|
| CN | 103200467 A | 7/2013 |

(Continued)

OTHER PUBLICATIONS

Camp et al., U.S. Appl. No. 14/581,954, filed Dec. 23, 2014.

(Continued)

*Primary Examiner* — Stephen Elmore
(74) *Attorney, Agent, or Firm* — Zilka-Kotab, P.C.

(57) ABSTRACT

A method, according to one embodiment, includes repeating the following sequence at least until a page stripe of a memory cache has at least a predetermined amount of data stored therein: receiving a compressed logical page of data, finding an open codeword having an amount of available space which is greater than or equal to a size of the compressed logical page, and storing the compressed logical page in the open codeword having the amount of available space which is greater than or equal to a size of the compressed logical page. The compressed logical page does not straddle out of the open codeword. Other systems, methods, and computer program products are described in additional embodiments.

20 Claims, 12 Drawing Sheets

(56) References Cited

U.S. PATENT DOCUMENTS

| | | | |
|---|---|---|---|
| 6,857,087 | B2 | 2/2005 | Crozier et al. |
| 7,437,492 | B2 | 10/2008 | Stager et al. |
| 7,904,640 | B2 | 3/2011 | Yano et al. |
| 8,176,381 | B2 | 5/2012 | Djordjevic et al. |
| 8,533,550 | B2 | 9/2013 | Khan |
| 8,560,926 | B2 | 10/2013 | Yeh |
| 8,601,210 | B2 | 12/2013 | Jibbe et al. |
| 8,692,696 | B2 * | 4/2014 | Cideciyan ............... H03M 7/40 341/50 |
| 8,751,904 | B2 | 6/2014 | Wang et al. |
| 8,793,556 | B1 * | 7/2014 | Northcott ............ G06F 11/1068 365/185.29 |
| 8,868,854 | B2 * | 10/2014 | Yang ..................... G06F 3/0611 711/155 |
| 8,943,266 | B2 * | 1/2015 | Koseki .................. G06F 11/108 711/103 |
| 8,954,693 | B2 | 2/2015 | Seo et al. |
| 9,063,874 | B2 | 6/2015 | Zhong et al. |
| 9,529,535 | B2 * | 12/2016 | Koseki .................. G06F 11/108 |
| 9,552,163 | B1 * | 1/2017 | Chun ..................... G06F 3/0608 |
| 2003/0071653 | A1 | 4/2003 | Carberry et al. |
| 2008/0059695 | A1 | 3/2008 | Tanaka et al. |
| 2008/0126742 | A1 | 5/2008 | Shupak et al. |
| 2008/0137419 | A1 | 6/2008 | Cernea |
| 2009/0216936 | A1 | 8/2009 | Chu et al. |
| 2011/0154158 | A1 | 6/2011 | Yurzola et al. |
| 2012/0063533 | A1 | 3/2012 | Fonseka et al. |
| 2012/0072801 | A1 | 3/2012 | Takeuchi et al. |
| 2012/0260150 | A1 | 10/2012 | Cideciyan et al. |
| 2013/0013974 | A1 | 1/2013 | Cideciyan et al. |
| 2013/0114339 | A1 | 5/2013 | Kawamura et al. |
| 2013/0132504 | A1 | 5/2013 | Kohli et al. |
| 2013/0151803 | A1 | 6/2013 | Tofano |
| 2013/0179752 | A1 | 7/2013 | Shim et al. |
| 2013/0246721 | A1 | 9/2013 | Fukutomi et al. |
| 2013/0318051 | A1 | 11/2013 | Kumar et al. |
| 2014/0026013 | A1 | 1/2014 | Koseki |
| 2014/0032861 | A1 | 1/2014 | Islam et al. |
| 2014/0258628 | A1 | 9/2014 | Shivashankaraiah et al. |
| 2014/0281168 | A1 * | 9/2014 | Koseki .................. G06F 11/108 711/103 |
| 2015/0100721 | A1 * | 4/2015 | Koseki .................. G06F 11/108 711/103 |
| 2015/0154118 | A1 | 6/2015 | Marcu et al. |
| 2015/0220277 | A1 | 8/2015 | Lee et al. |
| 2015/0227418 | A1 | 8/2015 | Cai et al. |
| 2016/0048354 | A1 | 2/2016 | Walsh et al. |
| 2016/0077960 | A1 | 3/2016 | Hung et al. |
| 2016/0132392 | A1 | 5/2016 | Ioannou et al. |
| 2016/0179614 | A1 | 6/2016 | Camp et al. |
| 2017/0004034 | A1 * | 1/2017 | Stewart ................ G06F 3/0619 |

FOREIGN PATENT DOCUMENTS

| | | | |
|---|---|---|---|
| CN | 103941116 | A | 7/2014 |
| CN | 104123238 | A | 10/2014 |
| EP | 1632845 | A2 | 3/2006 |
| KR | 101379883 | B1 | 4/2014 |
| WO | 8909468 | A1 | 10/1989 |
| WO | 2007084751 | A2 | 7/2007 |
| WO | 2013147819 | A1 | 10/2013 |

OTHER PUBLICATIONS

International Business Machines Corporation, UK Patent Application No. 1407279.7, filed Apr. 25, 2014.

Ioannou et al., U.S. Appl. No. 14/536,550, filed Nov. 7, 2014.

Justesen, "Error Correcting Coding for OTN," IEEE Communications Magazine, ITU-T Optical Transport Network, Sep. 2010, pp. 70-75.

Justesen, "Performance of Product Codes and Related Structures with Iterated Decoding," IEEE Transactions on Communications, vol. 59, No. 2, Feb. 2011, pp. 407-415.

Lim, et al., "SILT: A Memory-Efficient, High-Performance Key-Value Store," SOSP '11, Oct. 23-26, 2011, pp. 1-13.

Redmill et al., "The EREC: An Error-Resilient Technique for Coding Variable-Length Blocks of Data," IEEE Transactions on Image Processing, vol. 5, No. 4, Apr. 1996, pp. 565-574.

Statement of Relevance of Non-Translated Foreign Document for CN101958720.

Van, et al., "A Novel Error Correcting System Based on Product Codes for Future Magnetic Recording Channels," 2011, pp. 1-4.

Wu, et al., "Reducing SSD Read Latency via NAND Flash Program and Erase Suspension," 2012, pp. 1-7.

Yang, et al., "Product Code Schemes for Error Correction in MLC NAND Flash Memories," IEEE Transactions on Very Large Scale Integration (VLSI) Systems, 2011, pp. 1-13.

Zuck, A. et. al., "Compression and SSD: Where and How?" INFLOW, Oct. 5, 2014, pp. 1-10.

Chen, X. et. al., "C-Pack: A High-Performance Microprocessor Cache Compression Algorithm," IEEE Transactions on Very Large Scale Integration (VLSI) Systems, vol. 18, No. 8, Aug. 2010, pp. 1196-1208.

Sadler, C. et. al., "Data Compression Algorithms for Energy-Constrained Devices in Delay Tolerant Networks," SenSys '06, Nov. 1-3, 2006, pp. 265-278.

Non-Final Office Action from U.S Appl. No. 14/536,550, dated Jul. 1, 2016.

Final Office Action from U.S. Appl. No. 14/536,550, dated Dec. 29, 2016.

Non-Final Office Action from U.S Appl. No. 14/581,954, dated Aug. 26, 2016.

Gupta et al., "DFTL: A Flash Translation Layer Employing Demand-based Selective Caching of Page-level Address Mappings," ASPLOS '09, Mar. 7-11, 2009, pp. 1-12.

Final Office Action from U.S. Appl. No. 14/581,954, dated Feb. 21, 2017.

Notice of Allowance from U.S. Appl. No. 14/536,550, dated Mar. 14, 2017.

Camp et al., U.S. Appl. No. 15/589,686, filed May 8, 2017.

* cited by examiner

DATA PACKING FOR COMPRESSION-ENABLED STORAGE SYSTEMS

BACKGROUND

The present invention relates to data storage systems, and more particularly, this invention relates to adaptive processes for packing compressed logical pages into error correction code (ECC) codewords.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

However, in Flash-based SSDs, memory locations are erased in blocks prior to being written to. The size of an erase block unit is typically 256 pages and the erase operations takes approximately one order of magnitude more time than a page program operation. Due to the intrinsic properties of NAND Flash, Flash-based SSDs write data out-of-place whereby a mapping table maps logical addresses of the written data to physical ones. This mapping table is typically referred to as the Logical-to-Physical Table (LPT).

As Flash-based memory cells exhibit read errors and/or failures due to wear or other reasons, additional redundancy may be used within memory pages as well as across memory chips (e.g., RAID-5 and RAID-6 like schemes). The additional redundancy within memory pages may include ECC codewords which, for example, may include Bose, Chaudhuri, and Hocquenghem (BCH) codes. Logical pages of memory may be packed into payloads of ECC, whereby the ECC codewords may be used to recover data of the corresponding logical pages.

However, the implementation of ECC codewords with respect to the logical pages of memory has been undesirable in conventional products. Specifically, ECC codewords have a fixed payload size, which limits the amount of data the ECC codeword can protect. Moreover, the fixed payload size of the ECC codewords is not well aligned with the size of uncompressed logical pages in memory. Furthermore, some non-volatile memory systems implement compression of the logical pages in memory, whereby a compressor will compress each logical page to a different size (e.g., length) than its original size. However, the length of a compressed logical page varies depending on the particular logical page and therefore the lengths of various compressed logical pages are inconsistent. This variety in compressed lengths exacerbates the misalignment experienced between the fixed payload size of ECC codewords and the logical pages when compressed logical pages are packed into payloads of ECC codewords.

Conventional attempts to fill the entire payload of ECC codewords result in compressed logical pages undesirably straddling between ECC codewords, thereby resulting in read amplification by requiring that two full ECC codewords be read and transferred from non-volatile memory to a controller in order to read back the single, straddled logical page. Straddling also increase latency when the straddling occurs across a physical page boundary, thereby requiring that two physical pages be read in addition to transferring two full ECC codewords from memory to a controller.

It follows that, a method which overcomes the aforementioned conventional shortcomings by providing an efficient method of filling ECC codeword payloads is greatly desired.

BRIEF SUMMARY

A method, according to one embodiment, includes repeating the following sequence at least until a page stripe of a memory cache has at least a predetermined amount of data stored therein: receiving a compressed logical page of data, finding an open codeword having an amount of available space which is greater than or equal to a size of the compressed logical page, and storing the compressed logical page in the open codeword having the amount of available space which is greater than or equal to a size of the compressed logical page. The compressed logical page does not straddle out of the open codeword.

A system, according to another embodiment, includes a write cache, a plurality of non-volatile random access memory (NVRAM) blocks configured to store data, and a processor and logic integrated with and/or executable by the processor, the logic being configured to: pack compressed logical pages of data into open codewords without straddling until a next compressed logical page does not fit into any open codewords, determine whether a logical capacity loss is greater than a first threshold, and pack the compressed logical page in an open codeword having available space in response to determining that the logical capacity loss is greater than the first threshold. The compressed logical page straddles out of the open codeword.

A computer program product, according to yet another embodiment, includes a computer readable storage medium having program instructions embodied therewith, the program instructions readable and/or executable by a controller to cause the controller to: receive, by the controller, a compressed logical page of data, determine, by the controller, an amount of available space in each of a plurality of open codewords sequentially, determine, by the controller, whether the amount of available space in any of the plurality of open codewords is greater than or equal to a size of the compressed logical page, pack, by the controller, the compressed logical page in an open codeword having an amount of available space which is greater than or equal to the size of the compressed logical page in response to determining that the amount of available space in any of the plurality of open codewords is greater than or equal to the size of the compressed logical page, calculate, by the controller, a logical capacity loss in response to determining that the amount of available space in each of the plurality of open codewords is not greater than or equal to the size of the compressed logical page, determine, by the controller, whether the logical capacity loss is greater than a threshold, and write, by the controller, the data corresponding to the compressed logical pages in all open codewords to a non-volatile random access memory in response to determining that the logical capacity loss is not greater than the threshold.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed descrip-

DETAILED DESCRIPTION

Figure 1:
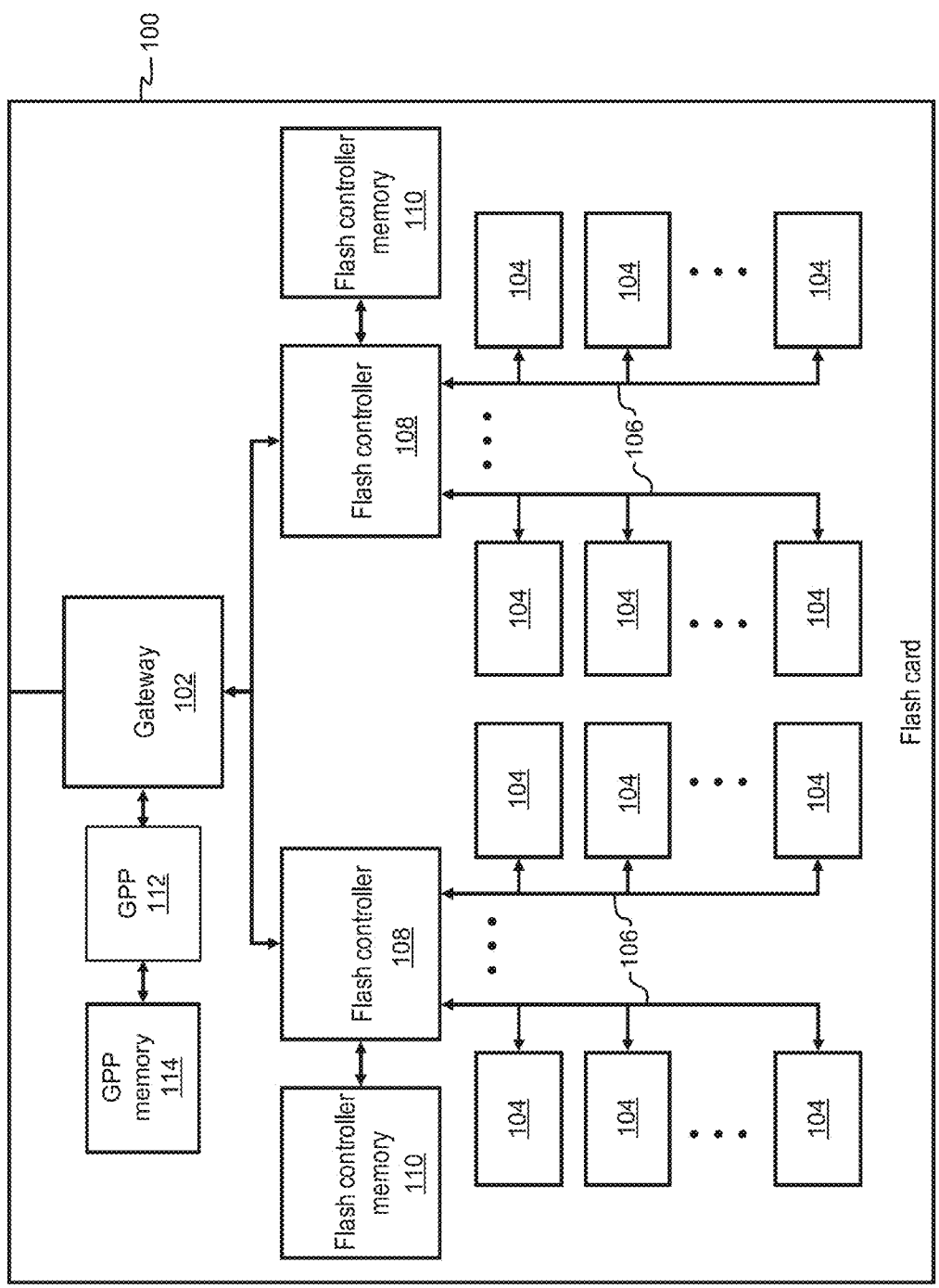
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a method includes repeating the following sequence at least until a page stripe of a memory cache has at least a predetermined amount of data stored therein: receiving a compressed logical page of data, finding an open codeword having an amount of available space which is greater than or equal to a size of the compressed logical page, and storing the compressed logical page in the open codeword having the amount of available space which is greater than or equal to a size of the compressed logical page. The compressed logical page does not straddle out of the open codeword.

In another general embodiment, a system includes a write cache, a plurality of non-volatile random access memory (NVRAM) blocks configured to store data, and a processor and logic integrated with and/or executable by the processor, the logic being configured to: pack compressed logical pages of data into open codewords without straddling until a next compressed logical page does not fit into any open codewords, determine whether a logical capacity loss is greater than a first threshold, and pack the compressed logical page in an open codeword having available space in response to determining that the logical capacity loss is greater than the first threshold. The compressed logical page straddles out of the open codeword.

In yet another general embodiment, a computer program product includes a computer readable storage medium having program instructions embodied therewith, the program instructions readable and/or executable by a controller to cause the controller to: receive, by the controller, a compressed logical page of data, determine, by the controller, an amount of available space in each of a plurality of open codewords sequentially, determine, by the controller, whether the amount of available space in any of the plurality of open codewords is greater than or equal to a size of the compressed logical page, pack, by the controller, the compressed logical page in an open codeword having an amount of available space which is greater than or equal to the size of the compressed logical page in response to determining that the amount of available space in any of the plurality of open codewords is greater than or equal to the size of the compressed logical page, calculate, by the controller, a logical capacity loss in response to determining that the amount of available space in each of the plurality of open codewords is not greater than or equal to the size of the compressed logical page, determine, by the controller, whether the logical capacity loss is greater than a threshold, and write, by the controller, the data corresponding to the compressed logical pages in all open codewords to a non-volatile random access memory in response to determining that the logical capacity loss is not greater than the threshold.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
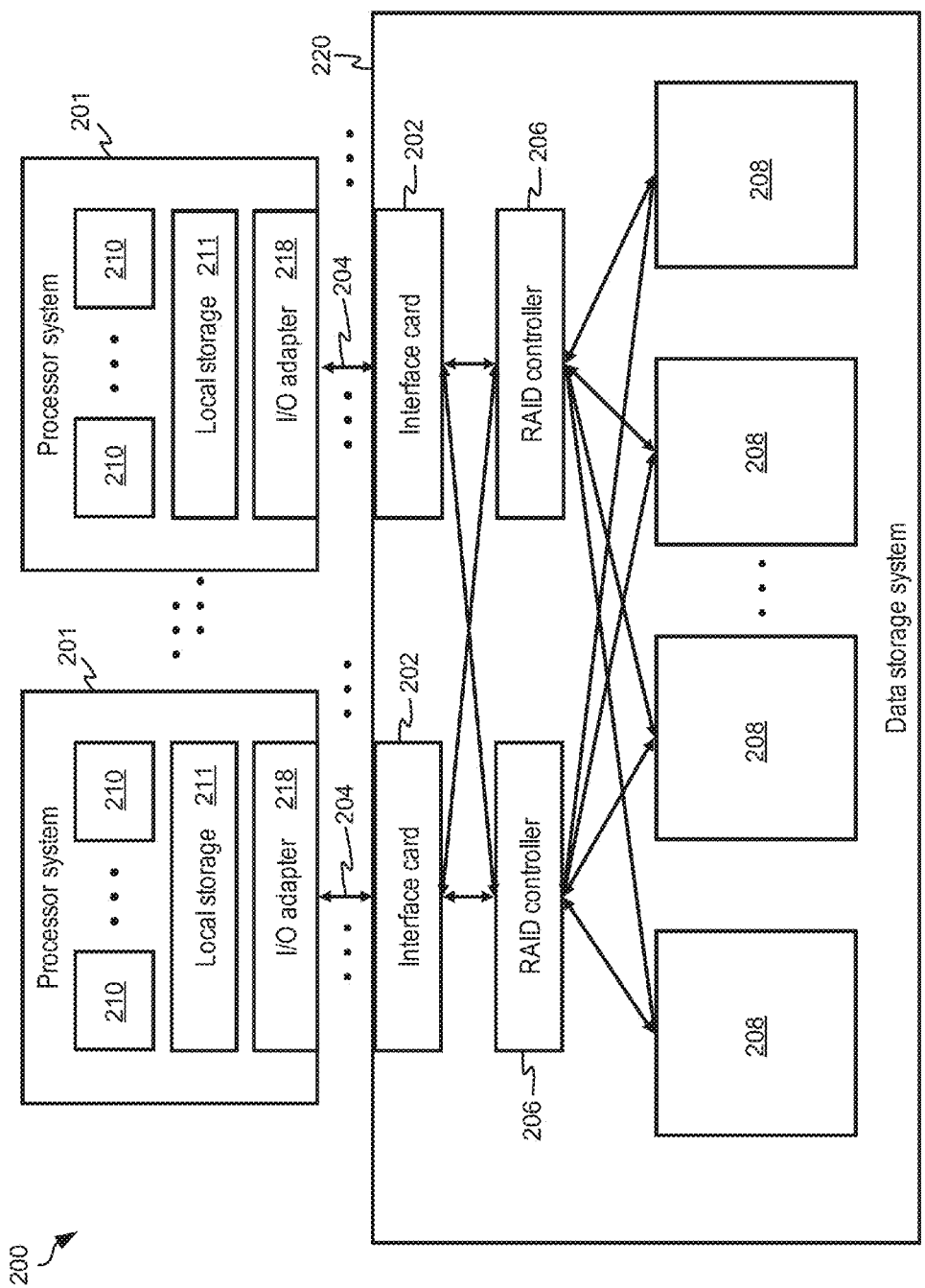
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, block-stripes may be identified for being reclaimed and/or relocated.

The unit of the garbage collection operation is also referred to herein as the Logical Erase Block (LEB). It should also be noted that an LEB include any multiple of the physical memory block, which is a unit of physical erasure. Moreover, the organization of memory blocks into LEBs allows for adding RAID-like parity protection schemes among memory blocks from different memory chips, memory planes and/or channels as well as significantly enhancing performance through higher parallelism.

According to an exemplary embodiment, which is in no way intended to limit the invention, memory controllers (e.g., see 108 of FIG. 1) may internally perform a garbage collection. As previously mentioned, the garbage collection may include selecting a block-stripe to be relocated, after which all data that is still valid on the selected block stripe may be relocated (e.g., moved). After the still valid data has been relocated, the entire block-stripe may be erased and thereafter, used for storing new data. The amount of data relocated from the garbage collected block-stripe determines the write amplification. Moreover, an efficient way to reduce the write amplification includes implementing heat segregation.

Heat Segregation

In the present context, the "heat" of data refers to the rate (e.g., frequency) at which the data is updated (e.g., rewritten with new data). Memory blocks that are considered "hot"

tend to have a frequent updated rate, while memory blocks that are considered "cold" have an update rate slower than hot blocks.

It should be noted that the number of read requests to and/or read operations performed on a memory block may not come into play when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore the write amplification incurred by performing garbage collection is much lower for embodiments implementing heat segregation.

Secondly, the relative heat of data can be utilized for wear leveling purposes. For example, hot data may be placed in younger (e.g., healthier) memory blocks, while cold data may be placed on older (e.g., less healthy) memory blocks relative to those younger memory blocks. Thus, the rate at which relatively older blocks are exposed to wear is effectively slowed, thereby improving the lifetime of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
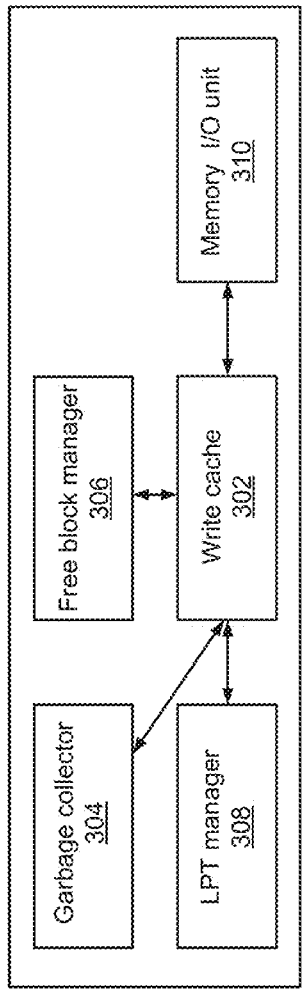
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4:
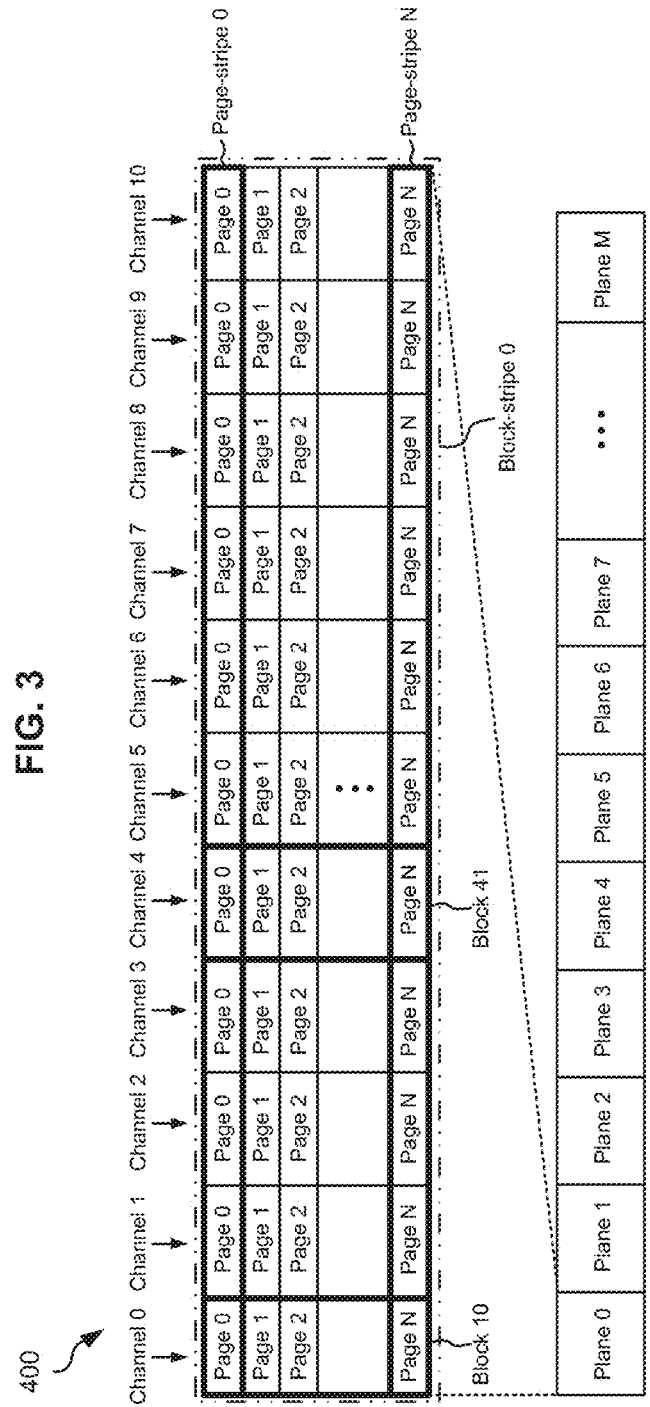
FIG. 4 is a conceptual diagram which includes a block-stripe and page-stripe, in accordance with one embodiment.

To better understand the distinction between block-stripes and page-stripes as used herein, FIG. 4 is a conceptual diagram 400, in accordance with one embodiment. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired embodiment, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 planes labeled "Plane 0" through "Plane M". When implemented with data stored in non-volatile memory, each plane on a channel may include a large set of blocks, e.g., typically in the order of 1024, 2048 or more. Moreover, one or more plane may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given embodiment of non-volatile memory may be determined by the number of blocks per plane and channel.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of Plane 0 may constitute a unique block when implemented in a cache architecture. Similarly, each channel may correspond to a single, individual block. For example, looking to conceptual diagram 400, Block 10 includes all pages (Page 0 through Page N) in Channel 0 while Block 41 corresponds to all pages in Channel 4, and so on.

In the context of a memory controller, e.g., which may be capable of implementing RAID at the channel level, a block-stripe is made up of multiple blocks which amount to a stripe of blocks. Looking still to FIG. 4, the multiple blocks of Plane 0 constitute Block-stripe 0. While all blocks in a block-stripe typically belong to the same plane, in some embodiments one or more blocks of a block-stripe may belong to different planes. It follows that each plane may include a block-stripe. Thus, according to an illustrative embodiment, Block 0 through Block 10 may constitute a block-stripe.

Regardless of whether the conceptual diagram 400 of FIG. 4 is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 256 pages, but could include more or less in various embodiments. Analogously, the number of channels per plane and/or the number of planes may vary depending on the desired embodiment.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

As non-volatile based memory cells exhibit read errors and/or failures due to wear or other reasons, additional redundancy may be used within memory pages as well as across memory chips (e.g., RAID-5 and RAID-6 like schemes). The additional redundancy within memory pages may include ECC codewords which, for example, may include BCH codes.

As previously mentioned, logical pages of memory may be packed into payloads of ECC codewords, whereby the ECC codewords may be used to recover data of the corresponding logical pages. However, the implementation of ECC codewords with respect to the logical pages of memory has been undesirable in conventional products. Specifically, ECC codewords have a fixed payload size, which limits the amount of data an ECC codeword can accommodate, and the fixed payload size of the ECC codewords is not well aligned with the size of uncompressed logical pages in memory. Furthermore, some non-volatile memory systems implement compression of the logical pages in memory, whereby a compressor will compress each logical page to a size (e.g., length) different than its original size. Moreover, the length of a compressed logical page varies depending on the particular logical page and therefore the lengths of various compressed logical pages are inconsistent. This variety in compressed lengths exacerbates the misalignment experienced between the fixed payload size of ECC codewords and the logical pages when compressed logical pages are packed into payloads of ECC codewords.

Conventional attempts to fill the entire payload of ECC codewords (also referred to herein as "tight packing") result in cases of compressed logical pages undesirably straddling between virtually every pair of ECC codewords. As a result, read amplification is increased by requiring that two full ECC codewords be read and transferred from non-volatile memory (e.g., to a controller) in order to read back each of the single, straddled logical pages. Rampant straddling seen in conventional implementations also increases latency when the straddling occurs across a physical page boundary, thereby requiring that two physical pages be read in addition to transferring two full ECC codewords from memory. Thus, the penalty for straddling is having to read multiple pages and being required to return a larger amount of data than desired. It follows that, a method which overcomes the aforementioned conventional shortcomings by providing an efficient method of filling ECC codeword payloads would be desirable.

To overcome the foregoing issues, various embodiments described and/or suggested herein include workload-adaptive algorithms for implementing adaptive packing schemes which efficiently pack compressed logical pages into ECC codewords, while also ensuring that straddling occurs as infrequently as possible. Moreover, the packing schemes described herein preferably also maintain a desired level of logical capacity, e.g., a capacity presented to a user. Thus, storage environments which implement a large variety in the length of compressed logical pages may implement some of the various embodiments described herein in order to pack the compressed logical pages into ECC codeword payloads (also referred to herein as ECC containers or open codewords) in such a way that the frequency in which a straddling events occur is minimized while also ensuring an efficient use of the ECC codeword container itself, particularly compared to conventional approaches.

Figure 5A:
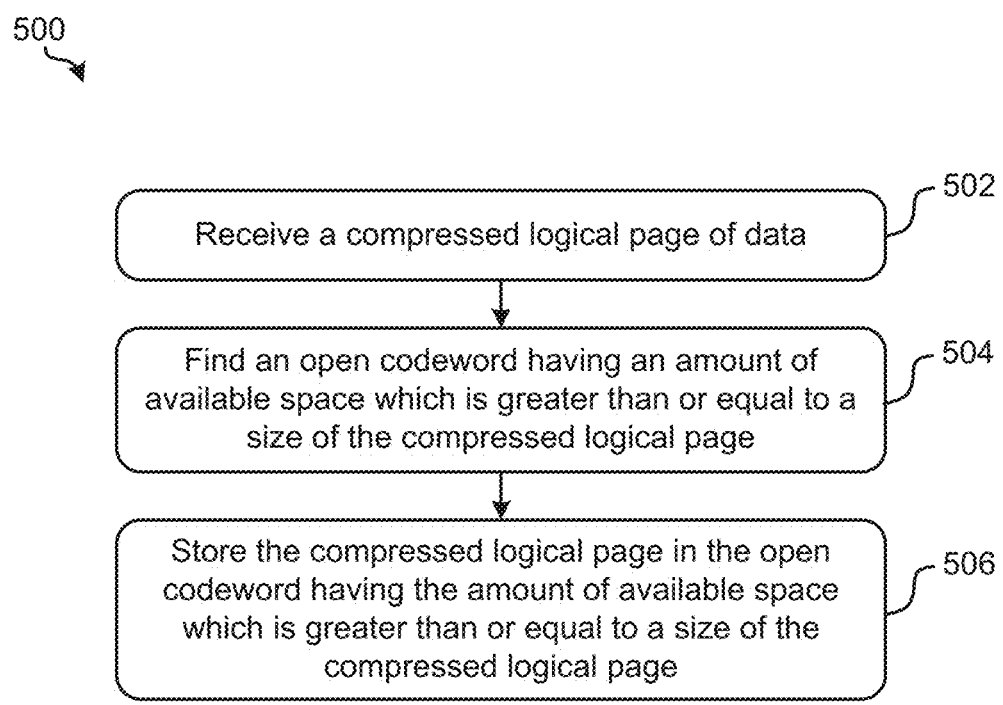
FIG. 5A is a flowchart of a process, in accordance with one embodiment.

FIG. 5A illustrates a flowchart of a method 500 for implementing an adaptive packing scheme according to one embodiment. The method 500 may be performed in accordance with the present invention in any of the environments depicted in FIGS. 1-4, among others, in various embodiments. More or less operations than those specifically described in FIG. 5A may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As illustrated in FIG. 5A, method 500 includes operation 502 where one or more compressed logical pages of data are received, e.g., from a compressor. Once compressed, a logical page may have a different length than another compressed logical page. According to an example, which is in no way intended to limit the invention, first and second logical pages may both have an uncompressed length of 256 128-bit words. However, after both of the first and second pages are compressed (e.g., by a compressor), the length of the first logical page may be reduced to a compressed length of 50 128-bit words, while the length of the second logical page may only be reduced to a compressed length of 200 128-bit words. According to another example, again which is in no way intended to limit the invention, a logical page with an uncompressed length of 256 128-bit words may only be shortened to a compressed length of 250 128-bit words after being compressed. Furthermore, some logical pages may not be compressible, e.g., if they have already been compressed during a previous logical process, are incompressible, etc. It follows that, according to various embodiments, the length of a compressed logical page varies depending on the particular logical page, and therefore the lengths of various compressed logical pages are inconsistent.

Accordingly, depending on the size of an ECC codeword container and/or the compressed lengths of various compressed logical pages as they are received, certain combinations of compressed logical pages may utilize the available space in an ECC codeword container more efficiently than other combinations, e.g., preferably without straddling to another ECC codeword. Thus, operation 504 includes finding an open codeword having an amount of available space which is greater than or equal to a size of the compressed logical page. In other words, operation 504 may include searching for, and hopefully finding an open codeword that is capable of storing the compressed logical page currently being processed without having the compressed logical page straddle into another ECC codeword.

In response to finding an open codeword having a sufficient amount of available space in operation 504, method 500 proceeds to operation 506 which includes storing the compressed logical page in the open codeword having the amount of available space which is greater than or equal to a size of the compressed logical page. It should be noted that if none of the open codewords examined have a sufficient amount of free space to store a present compressed logical page, different processes may be performed, e.g., depending on the desired embodiment as will be discussed in further detail below.

With continued reference to method 500, operation 504 may be performed, at least in part, by determining an amount of available space in each of a plurality of open codewords sequentially associated with a plurality of ECC codeword containers, e.g., which span across the multiple page stripes of a cache line.

Figure 5B:
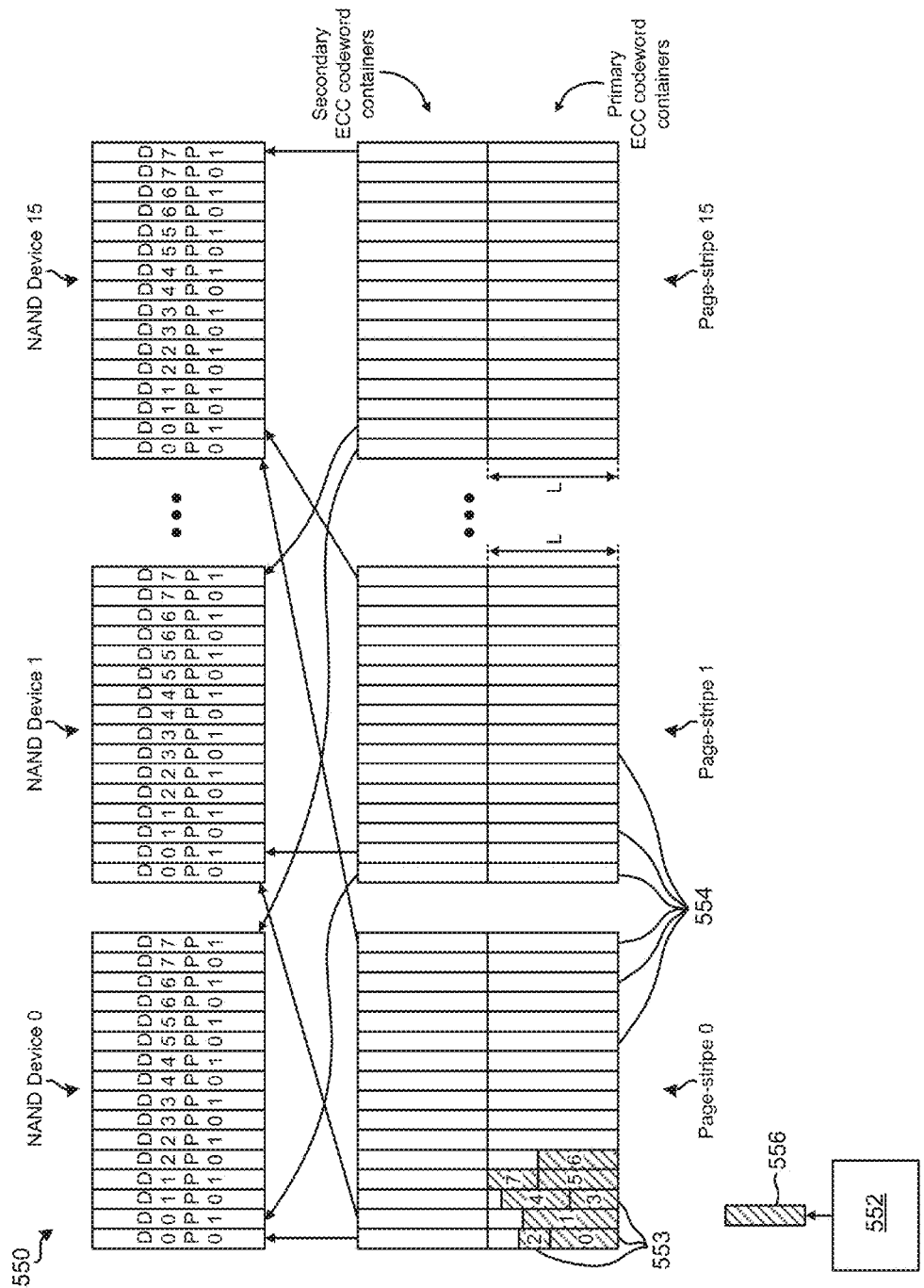
FIG. 5B is a representative diagram, in accordance with an illustrative embodiment.

A visual example of how method 500 may be implemented is shown in the representative diagram 550 of FIG. 5B. As a preliminary matter, it should be noted that although the representative diagram 550 includes scaled lengths for the compressed logical pages 553, and illustrative lengths of the ECC codeword containers 554, these values are presented by way of example only and are in no way intended to limit the inventive concepts presented herein.

Looking to the representative diagram 550 in FIG. 5B, Page stripe 0 through Page stripe 15 are mapped to respective die (D) and planes (P) of NAND Device 0 through NAND Device 15, which are sometimes referred to as "flash lanes" 0 and 15 respectively. It should also be noted that XOR parity information may be added to the last (rightmost) primary and/or secondary codewords, e.g., for RAID protection as would be appreciated by one skilled in the art upon reading the present description.

The compressed logical pages 553 have different lengths when received from the compressor 552, which has been represented by the relative length of each respective compressed logical page 553 as illustrated in the figure, which is presented by way of example only and is in no way intended to limit the invention. The compressed logical pages 553 have also been marked with a number to represent an exemplary order in which they were added to the ECC codeword containers. As will be described in further detail below, it is preferred that the compressed logical pages 553 are stored to the ECC codeword containers 554 (e.g., open codewords) in the same order which the compressed logical pages 553 are received. In other words, it is preferred that compressed logical pages are not sent to the ECC codeword containers 554 in a different order than that which they are received, e.g., resulting from buffering a plurality of received compressed logical pages 553.

Moreover, ECC codeword containers 554 are illustrated as having an exemplary length L 128-bit words, which is in no way intended to limit the invention. As previously mentioned, depending on the length of the compressed logical page 556 received from the compressor 552, the compressed logical page 556 may only be able to fit in a certain number of specific ECC containers 554, e.g., depending on the size of the ECC container 554 and/or the compressed lengths of the compressed logical pages 553 already stored therein. Thus, finding an ECC container 554 having a sufficient amount of free space to add the compressed logical page 556 to effectively utilize the ECC containers 554 without causing straddling, thereby allowing the present embodiment to overcome conventional shortcomings.

It is preferred that the amount of free space is determined in each of the ECC containers 554 sequentially. Moreover, it is preferred that the current compressed logical page 556 is stored in the first ECC container 554 determined to have a sufficient amount of free space to accommodate the compressed logical page 556 without straddling to the next ECC container. As a result, compressed logical pages 553 may be stored out of order within the ECC containers 554 in the sense that the compressed logical pages 553 may not be filled into the ECC containers 554 strictly from left to right. In other words, an order in which the compressed logical pages 553 are stored in the ECC containers 554 (e.g., open codewords) may be different than the order in which the compressed logical pages 553 are received.

For example, compressed logical page 0 of FIG. 5B was added to the leftmost ECC codeword container of Page stripe 0 as it was the first compressed logical page to be received and therefore the primary (lower) ECC codeword container of Page 0 in Page stripe 0 was the first ECC codeword container determined to have a sufficient amount of free space to store compressed logical page 0 without causing straddling thereof into the secondary (upper) ECC codeword container of Page 0 in Page stripe 0. Thereafter, compressed logical page 1 was not added to the primary ECC codeword container of Page 0 in Page stripe 0 because that ECC codeword container did not have a sufficient amount of free space available to store all of compressed logical page 1. Rather, compressed logical page 1 was added to the primary ECC codeword container of Page 1 in Page stripe 0 as that was the first ECC codeword container determined to have a sufficient amount of free space to store compressed logical page 1 without causing straddling thereof into another ECC codeword container. Further still, the primary ECC codeword container of Page 0 in Page stripe 0 was determined to have a sufficient amount of free space to store compressed logical page 2 without straddling, thereby resulting in compressed logical page 2 being stored in Page 0 rather than any subsequent pages of Page stripe 0.

However, it should be noted that an order in which the compressed logical pages are stored to the open codewords is preferably the same as an order in which the compressed logical pages are received. Accordingly, in some embodiments no more than two compressed logical pages may be buffered at a time, while in other embodiments, compressed logical pages may be sent from the compressor to the page stripe without effectively being buffered. Yet, in some embodiments, any one or more of the approaches described herein may be implemented in conjunction with a buffer that stores and/or selectively chooses desired combinations of compressed logical pages to add to each of the ECC codeword containers.

The process described in method 500 and illustrated in FIG. 550 may be repeated for each subsequently received compressed logical page at least until a page stripe of a memory cache, and preferably the entire cache line, has at least a predetermined amount of data stored therein, e.g., at least 80% full, at least 90% full, at least 98% full, etc. The predetermined amount of data may be preset in firmware, selectable by a user, etc. The process is preferably repeated until a received compressed logical page is unable to fit in any of the primary ECC containers of the multiple page stripes of a particular cache line. In other words, until none of the primary ECC containers of Page stripe 0 through Page stripe 15 in FIG. 5B (e.g., the entire cache line) have a sufficient amount of free space to store the received compressed logical page without causing straddling. Upon determining that a sufficient amount of free space does not exist in any of the primary ECC containers to store a complete compressed logical page therein, additional determinations may be made, e.g., based on an amount of unused free space in the primary ECC containers.

Referring still to FIG. 5B, although compressed logical pages 5 and 7 appear to fill the primary ECC container in Page 3 almost perfectly (e.g., essentially no unused free space), the primary ECC containers in Pages 0-2 and 4 are shown to have unused free space (unshaded area). It is preferred that the amount of unused free space is minimized, e.g., to prevent an undesirable loss of logical capacity. Thus, depending on a total amount of unused free space across the multiple page stripes of a cache line (or equivalently an amount of used space), increased processing requirements resulting from straddling one or more compressed logical pages may be weighed against the loss of logical capacity to determine further action, e.g., as described below with reference to FIG. 6.

Figure 6:
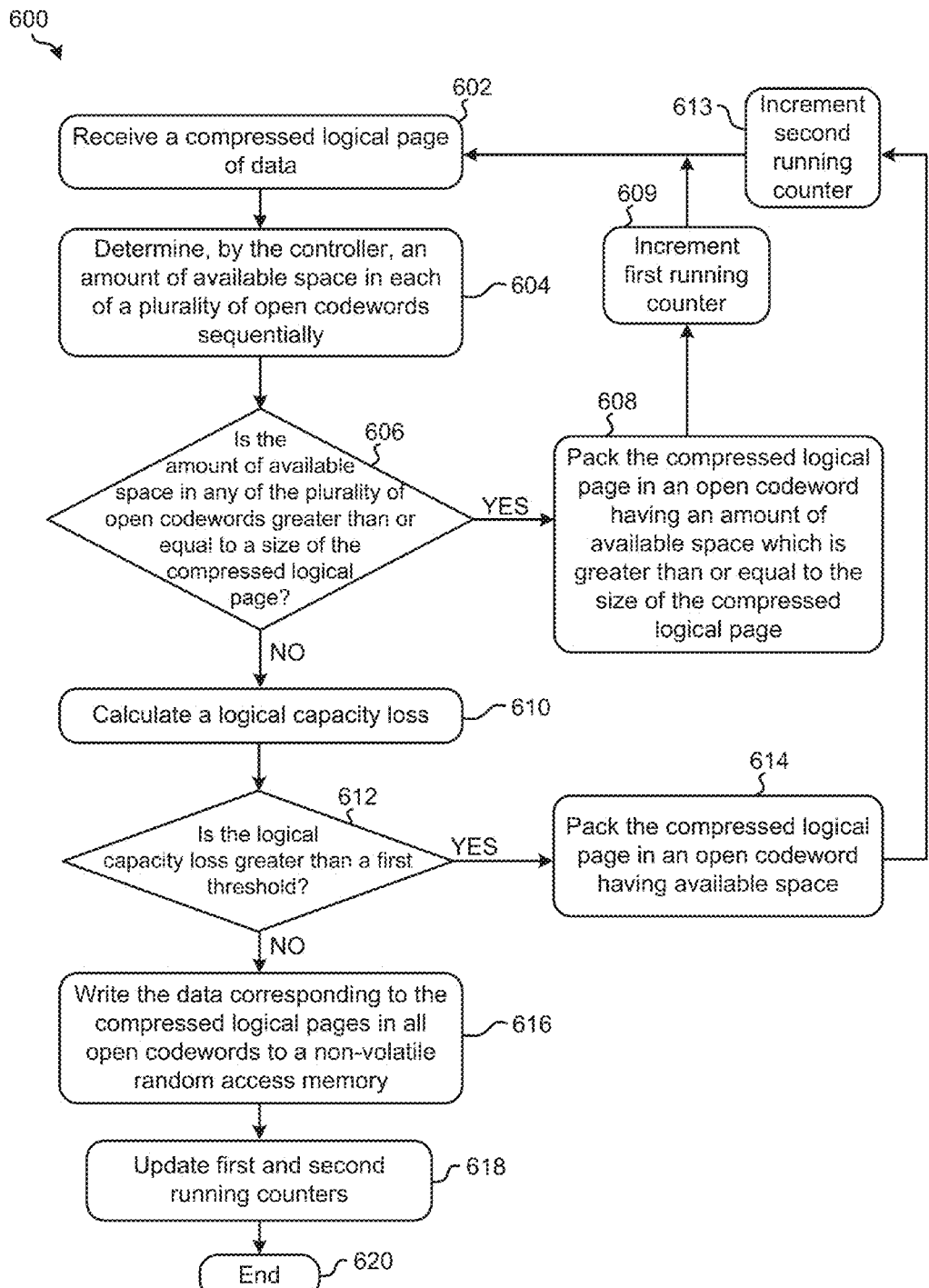
FIG. 6 is a flowchart of a process, in accordance with one embodiment.

FIG. 6 illustrates a flowchart of a method 600 for implementing an adaptive packing scheme according to one embodiment. The method 600 may be performed in accordance with the present invention in any of the environments depicted in FIGS. 1-5B, among others, in various embodiments. More or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a controller, a processor having logic integrated therewith and/or executable thereby (where the processor may be part of a controller), etc., or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As illustrated in FIG. 6, method 600 includes operation 602 where a compressed logical page of data is received, e.g., from a compressor as seen in FIG. 5B. Moreover, method 600 includes determining an amount of available space in each of a plurality of open codewords (e.g., codeword containers) sequentially. See operation 604. According to a preferred approach, the amount of available space in each of the open codewords may be determined using a controller.

Operation 606 includes determining whether the amount of available space in any of the plurality of open codewords is greater than or equal to a size of the compressed logical page. In other words, operation 606 may be used to determine whether any of the open logical pages are able to store the received compressed logical page without causing an overflow into another open logical page.

In response to determining that the amount of available space in any of the plurality of open codewords is greater than or equal to the size of the compressed logical page, method 600 proceeds to operation 608 which includes packing the compressed logical page in an open codeword having an amount of available space which is greater than or equal to the size of the compressed logical page. According to some approaches, the compressed logical page may be packed in the first open codeword having an amount of available space which is greater than or equal to the size of the compressed logical page. However, in other approaches, the compressed logical page may be packed in a randomly selected, predetermined, etc. open codeword having an amount of available space which is greater than or equal to the size of the compressed logical page.

Thereafter, method 600 proceeds to operation 609 which includes updating (e.g., incrementing) at least a first running counter F[i] in response to packing the compressed logical page in the open codeword. The first running counter F[i] keeps track of the length of each of the respective codeword payloads. Thus, depending on which open codeword the compressed logical page was packed into in operation 608, the first running counter may be updated accordingly.

For example, if a compressed logical page is packed into open codeword k' (i.e., k'=i), then looking to operation 609, the first running counter F[i] may be updated as follows:

$$F[i]=F[i]-clp\_len, \ i=k' \quad \text{Equation 1}$$

where clp_len represents the length of the compressed logical page packed into open codeword k'. Accordingly, the first running counter is updated such that the length of the codeword payload corresponding to open codeword k' is reduced by the length of compressed logical page clp_len added thereto. Accordingly, the next time open codeword k' is queried to determine an amount of open space therein, F[k'] will relay that a portion of open codeword k' has been used to store the previously added compressed logical page.

Furthermore, method 600 returns to operation 602 to receive a next compressed logical page of data, e.g., from the compressor. It should be noted that when method 600 returns to operation 602, the processor, controller, etc. performing one or more of the processes of method 600 may enter a "standby mode" at least until the next compressed logical page is actually received. While in the standby mode, power consumption, processing requirements, etc. may be reduced to improve efficiency while waiting for the next compressed logical page. Moreover, when another compressed logical page is received in operation 602, the processor, controller, etc. may re-enter a runtime mode whereby full processing, computational, etc. functionality is restored.

Returning to decision 606, in response to determining that the amount of available space in each of the plurality of open codewords is not greater than or equal to the size of the compressed logical page, method 600 proceeds to operation 610 which includes calculating a logical capacity loss in the open codewords of the multiple page stripes of a particular cache line. As described above, it is preferred that the amount of unused free space is minimized, e.g., to prevent an undesirable loss of logical capacity. Thus, depending on a total amount of unused free space across the multiple page stripes of a cache line, increased processing requirements resulting from straddling one or more compressed logical pages may be weighed against the loss of logical capacity to determine further action. Moreover, according to preferred approaches, the logical capacity loss is calculated in real time, e.g., to ensure accurate values, but is in no way limited thereto. Exemplary equations which may be used to determine the logical capacity loss are described in detail below with reference to Equations 3-6C.

According to an illustrative approach, decision 612 includes determining whether the logical capacity loss for the multiple page stripes of a cache line is greater than a first threshold. Accordingly, the first threshold in decision 612 may represent a boundary between unacceptable logical capacity loss and intolerable increases to processing requirements. The value of the first threshold may be used to weigh the benefits of preventing unused portions of ECC containers with respect to the benefits of preventing read amplification and/or latency. For example, a lower first threshold may be used in situations where the benefits of high capacity gains outweigh the read amplification and/or latency associated with straddling. Alternatively, a higher first threshold may be used in situations where the read amplification and/or latency associated with straddling are unacceptable. It follows that the value of the first threshold may be determined, e.g., by a user, depending on the desired embodiment by balancing the results of increased capacity and straddling.

Moreover, a first threshold value may be tuned during operation to account for changing conditions, incoming compressed logical pages, ECC container size, etc. The first threshold implemented in an exemplary adaptive packing embodiment may even be 0, in which case the logical capacity loss would almost always be greater than the threshold. As a result, decision 612 may decide to straddle all compressed logical pages received which do not fully fit within a given ECC container until all ECC containers across the multiple page stripes are completely filled (there is no unused space). Although this scheme may prevent the waste of any amount of the ECC containers, doing so would come at the expense of having a plurality of compressed logical pages straddled across ECC containers and physical pages. Thus, although logical capacity loss for a given embodiment is preferably minimized, in application, the acceptable logical capacity loss may be greater than zero when the data is written to NVRAM, e.g., see operation 616 below. Again, the benefits of preventing unused portions of ECC containers may be weighed with respect to the benefits of preventing read amplification and/or latency resulting from straddling.

According to an exemplary approach, which is in no way intended to limit the invention, the first threshold may be 2% of an overall logical capacity of the plurality of open codewords of the cache line, but may be higher or lower depending on the desired embodiment. The first threshold may be predetermined, calculated in real-time, updated periodically, etc. Moreover, it should be noted that "greater than a first threshold" is in no way intended to limit the invention. Rather than determining whether a value is above a first threshold, equivalent determinations may be made, e.g., as to whether a value is within a predetermined range, having a value outside a predetermined range, having an absolute value above a first threshold, having a value below a first threshold, etc., depending on the desired approach.

Referring still to method 600, operation 614 includes packing the compressed logical page in an open codeword having available space (e.g., unused free space) in response to determining that the logical capacity loss is greater than the first threshold. The open codeword into which the compressed logical page is packed in operation 614 may be selected based on an amount of unused (open) space therein, based on a size of the compressed logical page, based on predetermined criteria, based on a second threshold (e.g., different than the threshold mentioned above), at random, etc. It follows that the open codeword into which the compressed logical page is packed may include any desired amount of unused space, e.g., depending on the desired embodiment.

For example, in some embodiments a second threshold may be implemented to determine whether a given open codeword had a sufficient amount of unused space. Accordingly, it may be determined whether a given open codeword has an amount of unused space greater than the second threshold. In such embodiments, the second threshold may (at least partially) be determined based on a size of the compressed logical page, e.g., to limit an amount of straddling caused. In other embodiments, a second threshold may (at least partially) be determined based on an amount of available space in each of the open codewords. For embodiments implementing a second threshold, the second threshold may be predetermined, calculated in real-time, updated periodically, etc. Moreover, it should be noted that "greater than a second threshold" is in no way intended to limit the invention. Rather than determining whether a value is above a second threshold, equivalent determinations may be made, e.g., as to whether a value is within a predetermined range, having a value outside a predetermined range, having an absolute value above a second threshold, having a value below a second threshold, etc., depending on the desired approach.

It follows that in preferred approaches, operation 614 includes packing the compressed logical page in an open codeword having the greatest amount of available space (e.g., unused free space) in response to determining that the logical capacity loss is greater than the capacity loss threshold. Accordingly, the amount of straddling that occurs may desirably be minimized.

Thus, operation 614 causes the compressed logical page to straddle out of the open codeword when it is determined that an undesirable amount of logical capacity loss would result otherwise. However, again it may be desired to limit the straddling to instances which span between ECC containers positioned on the same physical page, e.g., as opposed to instances which span between ECC containers positioned on two different physical pages. Thus, straddling between containers of the same page may be permitted, while straddling between containers on different pages is not. Yet, in some approaches it may be desirable to allow straddling between ECC containers on different physical pages as well. Thus, by selectively introducing straddling, the loss of undesirable amounts of ECC container capacity may be avoided.

It is preferred that an order of compressed logical pages in the open codewords is preserved. In other words, it is preferred that once the compressed logical pages are added into the open codewords, an order in which the compressed logical pages are packed in the open codewords is preserved at least until being written (flushed) to memory (NVRAM), e.g., even if one or more of the compressed logical pages are updated prior to being flushed. By preserving the order in which the compressed logical pages are packed into the open codewords, added processing consumption which would otherwise result from jockeying the pages within the ECC codewords is avoided.

However, according to some exemplary approaches, which are in no way intended to limit the invention, a selective reorganization of the compressed logical pages packed in the open codewords may be performed, e.g., by a controller and/or buffer. For example, dynamic programming may be used to determine a more efficient order of compressed logical pages (e.g., combination of compressed logical pages within open codewords) than an order in which the compressed logical pages are already packed in the open codeword. Thus, an order of compressed logical pages in the open codewords may be dynamically programmed before the compressed logical pages are written to memory. Dynamically programming the order of compressed logical pages already packed in the open codewords may achieve a more efficient packing order, thereby resulting in a greater amount of unused space in the open codewords. According to an example, performing dynamic programming on the codewords of a given embodiment may increase the amount of unused space in the codewords such that a compressed logical page which did not fit in any of the codewords without straddling prior to the dynamic programming, fits entirely within one of the codewords without straddling after the dynamic programming. Moreover, as would be appreciated by one skilled in the art upon reading the present description, dynamic programming of codewords may include additional processes, e.g., such as updating a LPT to reflect the changes to the order of the compressed logical pages in the open codewords resulting from a dynamic programming.

In some approaches, this selective reorganization may be in response to determining that the logical capacity loss is greater than a threshold. By selectively reorganizing the compressed logical pages in the ECC codewords, combinations of compressed logical pages which more efficiently utilize the space in the ECC codewords may be determined. Thus, different embodiments described herein may be able to implement aligned packing schemes and adaptive packing schemes as desired to achieve an efficient packing of compressed logical pages into one or more ECC codewords in a variety of different circumstances. As previously described, aligned packing may be implemented to achieve efficient ECC container packing for compressed logical pages that are significantly compressed, while adaptive packing schemes may be implemented when at least some (e.g., a majority) of the compressed logical pages are not significantly compressed, thereby ensuring that capacity loss is minimized. However, it should be noted that this process is presented by way of example only and is in no way intended to limit the invention.

With continued reference to FIG. 6, method 600 proceeds to operation 613 which includes updating (e.g., incrementing) at least a second running counter F_next[i] in response to packing the compressed logical page in the open codeword having the greatest amount of available space. Similar to the first running counter F[i], second running counter F_next[i] tracks how much free space an ECC codeword has, or equivalently, how much of an ECC codeword has been used, but for a secondary ECC container (e.g., see FIG. 5B). In other words, the second running counter F_next[i] tracks an amount of logical page overflow. According to an example, if open codeword m' is determined to have the greatest amount available space in operation 614, and a portion of a compressed logical page is packed into primary open codeword m", while the remaining portion of the compressed logical page is packed into secondary open codeword m" (i.e., m"=i) then looking to operation 613, the second running counter F_next[i] may be updated as follows:

$$F\_next[i]=F\_next[i]-(clp\_len-F[i]), i=m''  \quad \text{Equation 2}$$

where clp_len represents the length of the compressed logical page and clp_len−F[m"] determines the amount of the compressed logical page which straddles over to the secondary open codeword by subtracting the amount of the codeword packed into the primary open codeword from the overall length of the compressed logical page. Accordingly, the second running counter is updated such that the length of the secondary codeword payload corresponding to secondary open codeword m" is reduced by the overflowed length of compressed logical page clp_len added thereto. Moreover, F[m"] is updated to equal zero to represent that primary open codeword m" has been completely filled, e.g., has no more available space. Accordingly, the next time primary open codeword m" and/or secondary open codeword m" is queried to determine an amount of open space therein, F[m"] and/or F_next[m"] will relay that a portion of primary and/or secondary open codewords m" have been used to store the previously added compressed logical page.

After the second running counter has been updated, method 600 returns to operation 602 to receive a next compressed logical page of data, e.g., from the compressor. Again, when method 600 returns to operation 602, the processor, controller, etc. performing one or more of the processes (e.g., operations) of method 600 may enter a "standby mode" at least until the next compressed logical page is actually received.

However, returning to decision 612, in response to determining that the logical capacity loss is not greater than the first threshold, method 600 proceeds to operation 616 which includes writing the data corresponding to the compressed logical pages in all open primary ECC codewords to a NVRAM. Thus, as would be appreciated by one skilled in the art upon reading the present description, any data which straddled onto any of the secondary ECC codewords would carry-over even after the data from the primary ECC codewords were flushed to NVRAM.

According to some approaches, the open codewords may be sent to an ECC encoder before being written to NVRAM. As will be appreciated by one skilled in the art upon reading the present description, the ECC encoder may add a number of parity bits to the open codewords. Once the parity bits have been added, the whole sequence of compressed logical pages and the parity bits may be written to non-volatile memory, after which, the ECC containers may be reused in subsequent processes.

It is also preferred that an order of the compressed logical pages in the open codewords is preserved until the data corresponding to the compressed logical pages is written to a NVRAM and the codewords are flushed (e.g., emptied). Preserving the order of the compressed logical pages in the open codewords results in reduced processing requirements which may otherwise result from rewriting and/or repositioning compressed logical pages as they are updated while still stored in the open codewords.

Referring still to FIG. 6, after data of the compressed logical pages is written to NVRAM, the first and second running counters are updated as seen in operation 618, and the flowchart of method 600 ends. See operation 620. When the flowchart of method 600 ends, method 600 may return to operation 602 and/or enter a "standby mode" as described above, e.g., at least until the next compressed logical page is actually received. However, in some approaches the compressed logical page, which was not able to fit in any of the ECC codewords prior to the data stored therein being flushed to NVRAM, may be added to the first (likely now empty) ECC codeword before method 600 returns to operation 602 and awaiting another compressed logical page.

Updating the counters in operation 618 may preferably be performed by resetting the first and/or second running counters in response writing the data to the NVRAM. The first and/or second running counters may be reset to a starting value, e.g., such that F[i]=F_next[i] and F_next[i]= L_CW for all values of "i", where L_CW represents the original length of a codeword payload (e.g., amount of free space when empty), and F[i] represents the remaining unused space on a given lane "i". In preferred approaches, F[i] is measured in units of 128 bit words Embodiments which implement the operations of method 600 are able to overcome conventional shortcomings by efficiently balancing logical capacity loss and increased processing requirements, thereby maximizing the use of ECC containers without causing any undue straddling. It is preferred that the process performed in method 600 fully fills a plurality of open primary ECC containers without straddling to secondary ones of the ECC containers as often as possible, thereby achieving maximum use of the available space without introducing excessive read amplification and/or latency as experienced by conventional products. However, as described above, in some approaches the sequence of compressed logical pages received may only be able to fill a portion of all open codeword containers, i.e., less than 100% thereof. It may be desirable to allow partial filling of an ECC container when using adaptive packing schemes as described herein. Thus, in some instances, it may be desirable for any of the approaches described herein to sacrifice ECC container packing efficiency in order to prevent the read amplification and/or latency experienced in conventional products, e.g., due to straddling.

As mentioned above, certain equations may be used to calculate the logical capacity loss of a given plurality of ECC containers according to a given embodiment. The Equations 3-6c may be performed in accordance with the present invention in any of the environments depicted in FIGS. 1-6, among others, in various embodiments. More or less equations than those specifically described below may be included in some embodiments, as would be understood by one of skill in the art upon reading the present descriptions.

Looking below to Equation 3, the maximum logical capacity achievable for a given cache line (log_cap_max) may be determined by:

$$\log\_cap\_max = N\_CACHE \times L\_CW \times CR \qquad \text{Equation 3}$$

where N_CACHE represents the number of open codewords in a cache line, L_CW represents the length of a codeword payload, and CR represents the compression ratio. In preferred approaches, L_CW is measured in units of 128 bit words.

Equation 4 may be used to determine the amount of physical space currently wasted in the cache line (phy_cap_waste).

$$\text{phy\_cap\_waste} = \text{sum}(F) \qquad \text{Equation 4}$$

It follows that the actual logical capacity (log_cap) may thereby be represented as shown in Equation 5.

$$\log\_cap = (N\_CACHE \times L\_CW - \text{sum}(F)) \times CR \qquad \text{Equation 5}$$

Furthermore, the percent of logical capacity wasted (log_loss) may be calculated as shown in Equation 6a, $$\log\_loss = 1 - \log\_cap / \log\_cap\_max \qquad \text{Equation 6a}$$

which may be simplified as shown in Equation 6b, $$\log\_loss = 1 - (N\_CACHE \times L\_CW - \text{sum}(F)) / N\_CACHE / L\_CW \qquad \text{Equation 6b}$$

and further simplified as shown in Equation 6c.

$$\log\_loss = \text{sum}(F) / N\_CACHE / L\_CW \qquad \text{Equation 6c}$$

It should be noted that although illustrative equations are presented herein, they are in no way intended to limit the inventive concepts presented herein. Different equations may be implemented as would be appreciated by one skilled in the art upon reading the present description.

Figure 7A:
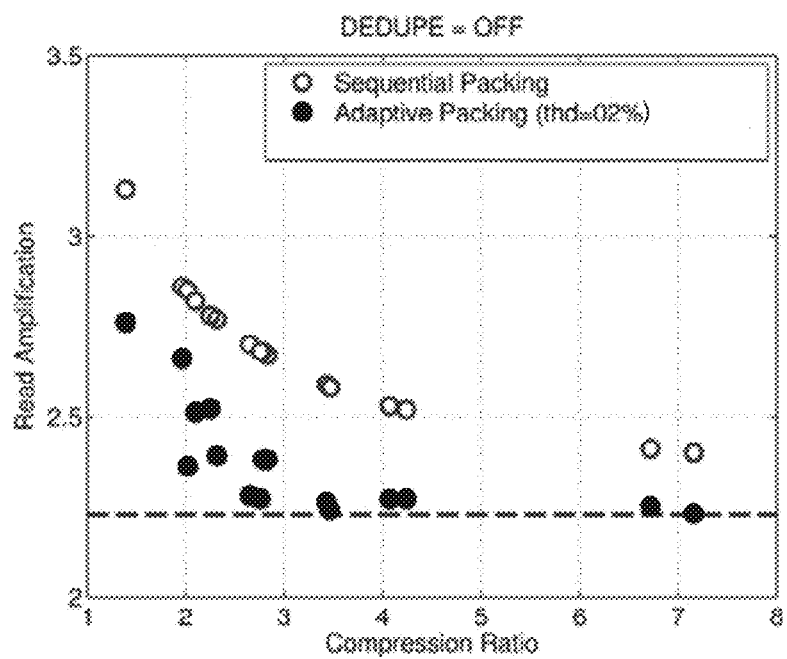
FIG. 7A is a graph of read amplification with respect to compression ratio, in accordance with multiple embodiments.

FIG. 7A includes a graph 700 which exemplifies illustrative read amplification with respect to compression ratios for various embodiments without implementing deduplication. Specifically, embodiments implementing adaptive packing according to embodiments described and/or suggested herein are compared with "sequential packing." According to the present description, sequential packing includes a process of packing each received compressed logical page into a given primary codeword until straddling occurs onto the secondary codeword, whereby the next primary codeword may be filled, again until straddling occurs. Thus, straddling may occur for every codeword when implementing sequential packing.

As shown in graph 700, desirable reductions in read amplification experienced by the embodiments implementing adaptive packing are achieved across a wide range of compression ratios. Specifically, the inventors determined that minimal read amplification was achieved for files having a compression ratio of greater than about 2.5x. Looking to the data presented in graph 700, the files having a compression ratio of greater than about 2.5x are illustrated as falling at, or below, the dashed horizontal line which represents the minimal achievable read amplification. It should also be noted that although the compression ratios are represented in the present approaches as percentages (i.e., uncompressed_length/compressed_length), in other approaches, compressed ratios may be represented as a fractions and/or multiples, e.g., 2.5x, indicating that the data is 2.5 times smaller than at an uncompressed state "x".

Figure 7B:
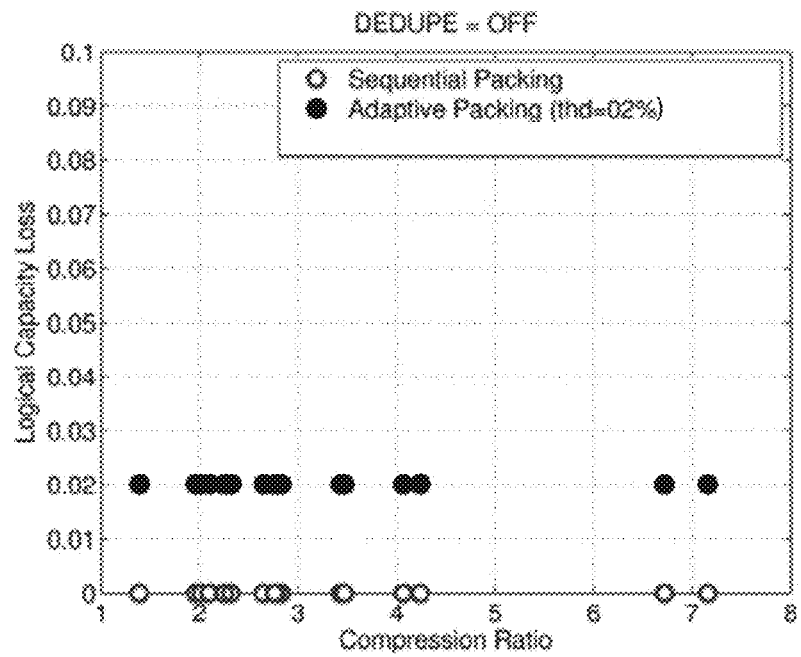
FIG. 7B is a graph of logical capacity loss with respect to compression ratio, in accordance with the embodiments illustrated in FIG. 7A.

Moreover, looking to graph 710 of FIG. 7B, the logical capacity loss experienced by implementing the adaptive packing methods compared to sequential packing methods is limited to 2% or less, e.g., corresponding to the logical capacity loss threshold.

Figure 7C:
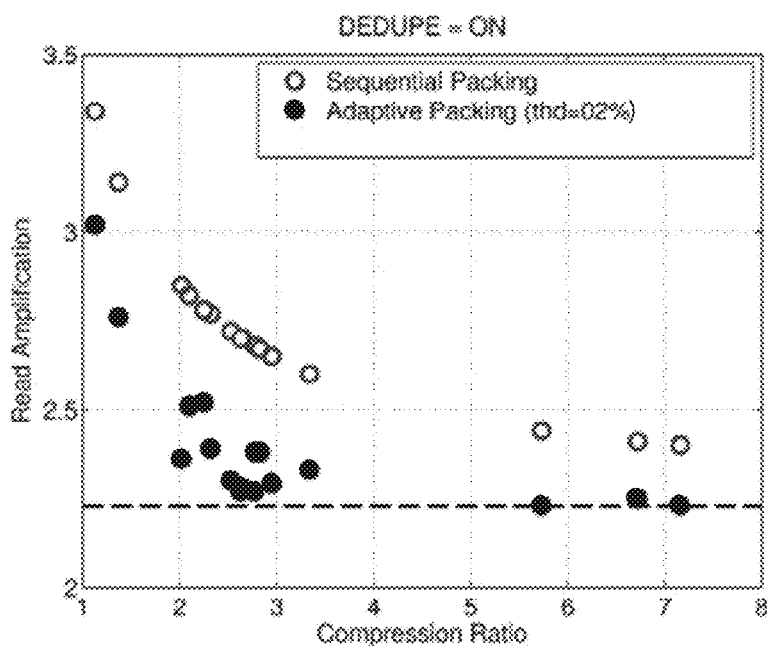
FIG. 7C is a graph of read amplification with respect to compression ratio, in accordance with multiple embodiments.
Figure 7D:
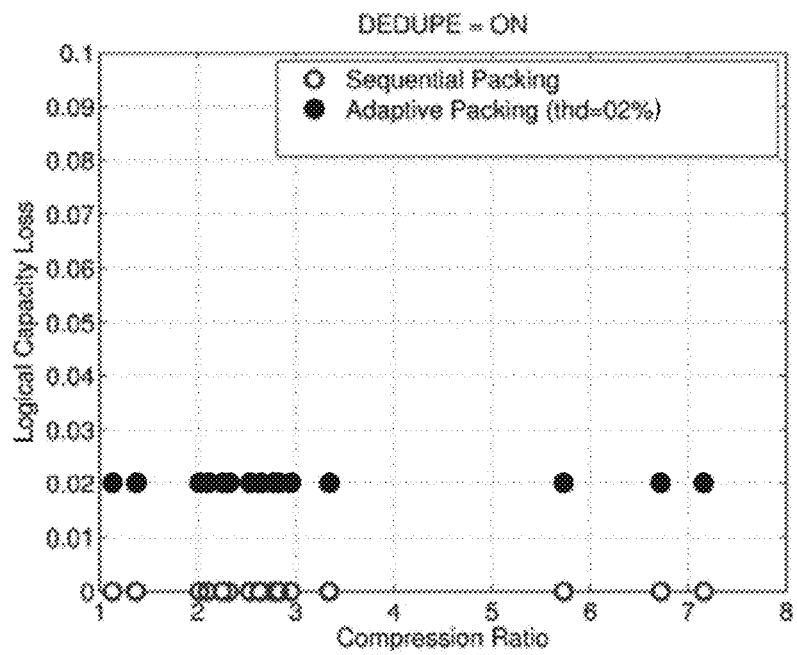
FIG. 7D is a graph of logical capacity loss with respect to compression ratio, in accordance with the embodiments illustrated in FIG. 7C.

Moreover, looking to graphs 720, 730 of FIGS. 7C-7D respectively, similarly desirable reductions to read amplification are achieved by implementing adaptive packing compared to sequential packing while deduplication is also enabled. Again, the logical capacity loss experienced by implementing the adaptive packing methods compared to sequential packing methods is limited to 2%, e.g., corresponding to the logical capacity loss threshold.

Accordingly, the improvements to read amplification resulting from the implementation of adaptive packing processes come at a minimal and adjustable increase in logical capacity loss.

Figure 8A:
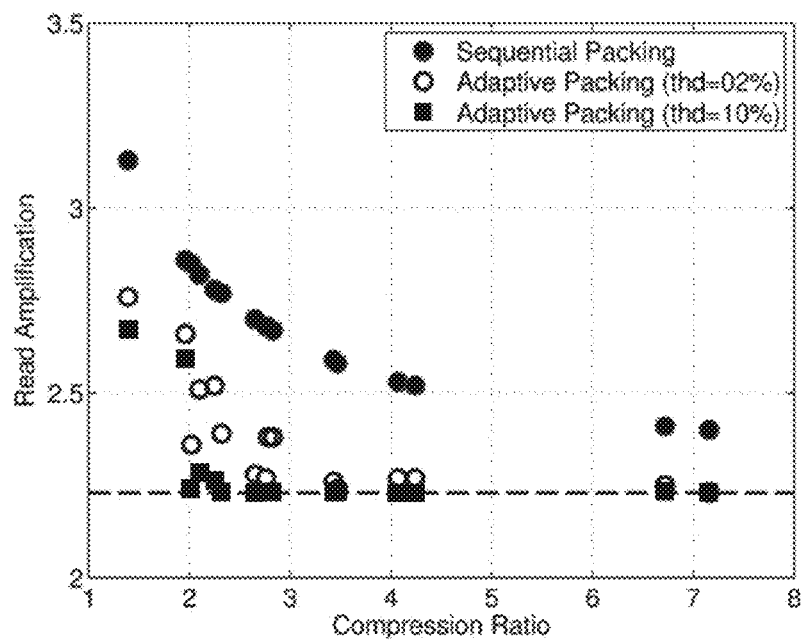
FIG. 8A is a graph of read amplification with respect to compression ratio, in accordance with multiple embodiments.
Figure 8B:
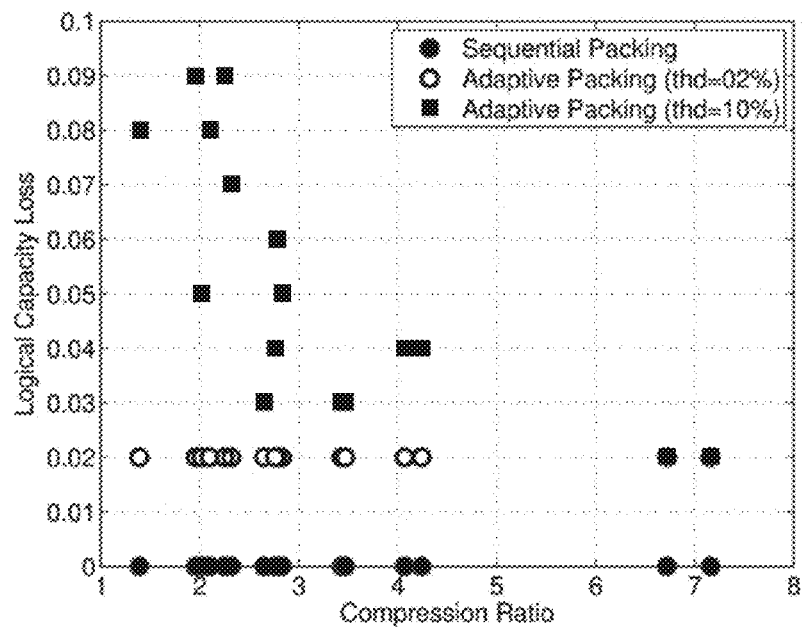
FIG. 8B is a graph of logical capacity loss with respect to compression ratio, in accordance with the embodiments illustrated in FIG. 8A.

Looking to graphs 800 and 810 of FIGS. 8A-8B, similar achievements are shown for embodiments implementing a logical capacity loss limit of about 10%. FIG. 8A shows that implementing a logical capacity loss limit of about 10% (thd=10%) results in even further reduced read amplification than embodiments implementing a logical capacity loss limit of about 2% (thd=02%). Moreover, implementing a logical capacity loss limit of about 2% allows for minimal read amplification to be achieved for all workloads with compression ratios of greater than about 3x, whereas implementing a logical capacity loss limit of about 10% allows for the minimal read amplification to be achieved for all workloads with compression ratios greater than about 2x.

However, looking to FIG. 8B, it is apparent that the improvements in read amplification come at the expense of logical capacity loss. As the logical capacity loss limit threshold is increased, the effectiveness of the adaptive packing scheme rises as well in terms of read amplification, but in turn the capacity which is exposed, e.g., to a user, is sacrificed. This dichotomy illustrates the balancing of logical capacity loss and straddling described herein. It follows that the logical capacity loss limit may be determined based on a user's operating requirements, desired output, data sensitivity, etc.

According to an in-use embodiment, any one or more of the operations and/or determinations described above with reference to FIGS. 5A and 6 may be performed by a computer program product comprising a computer readable storage medium having program instructions embodied therewith. Specifically, the program instructions may be readable and/or executable by a controller to cause the controller to perform the one or more of the operations and/or determinations, as would be appreciated by one skilled in the art upon reading the present description.

However, according to another in-use embodiment, any one or more of the operations and/or determinations described above with reference to FIGS. 5A and 6 may be performed by a system which includes a write cache (e.g., see 302 of FIG. 3) and/or one or more NVRAM blocks preferably configured to store data (e.g., see 104 of FIG. 1), in addition to a processor and logic integrated with and/or executable by the processor to perform the one or more of the operations and/or determinations, as would be appreciated by one skilled in the art upon reading the present description.

It follows that various embodiments described and/or suggested herein include workload-adaptive algorithms for efficiently packing compressed logical pages into ECC codewords. Algorithms for packing compressed logical pages (e.g., user logical pages) into ECC containers disclosed herein are able to achieve minimal read latency and minimal read amplification performance in addition to achieving improved storage capacity for a sufficiently compressible workload.

However, according to some exemplary approaches, which are in no way intended to limit the invention, any one or more of the approaches described herein may be implemented in conjunction with a buffer that stores and/or selectively chooses desired combinations of compressed logical pages to add to each of the ECC codeword containers as the compressed logical pages are received. Thus, a buffer may be used to determine efficient combinations of compressed logical pages to pack data into the ECC codeword containers as the compressed logical pages are received. As previously described, aligned packing may be implemented to achieve efficient ECC container packing for compressed logical pages that are significantly compressed, while adaptive packing schemes may be implemented when compressed logical pages are not all significantly compressed, thereby ensuring that capacity loss is minimized. Thus, different embodiments described herein are able to implement aligned packing schemes and adaptive packing schemes as desired to achieve an efficient packing of compressed logical pages into one or more ECC codewords in a variety of different circumstances.

Moreover, any of the approaches described herein may be implemented using dynamic programming, e.g., as described above. Accordingly, dynamic programming may be implemented to rearrange the order in which compress logical pages have been stored to open codewords, e.g., prior to being written to memory. It follows that storage environments which include compressed logical pages of different lengths may implement some of the various approaches described herein in order to pack the compressed logical pages into ECC containers in a desirable way, thereby ensuring an efficient use of ECC containers, particularly compared to conventional approaches.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 9:
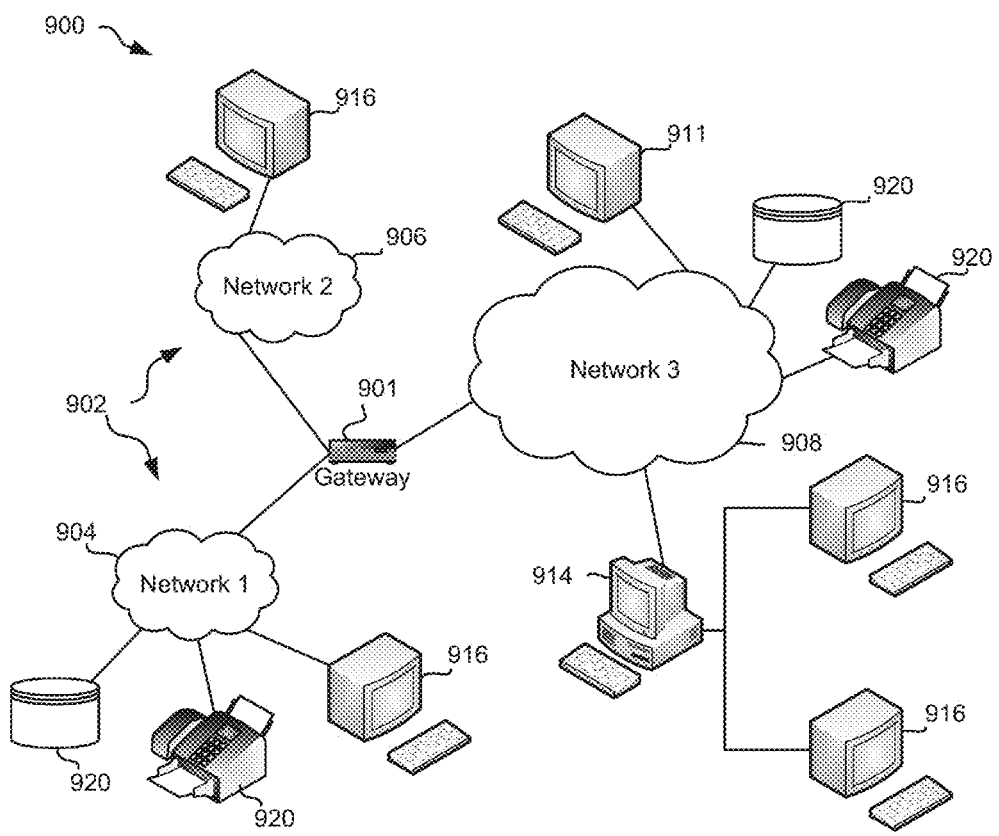
FIG. 9 is a network architecture, in accordance with one embodiment.

FIG. 9 illustrates a network architecture 900, in accordance with one embodiment. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some embodiments.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
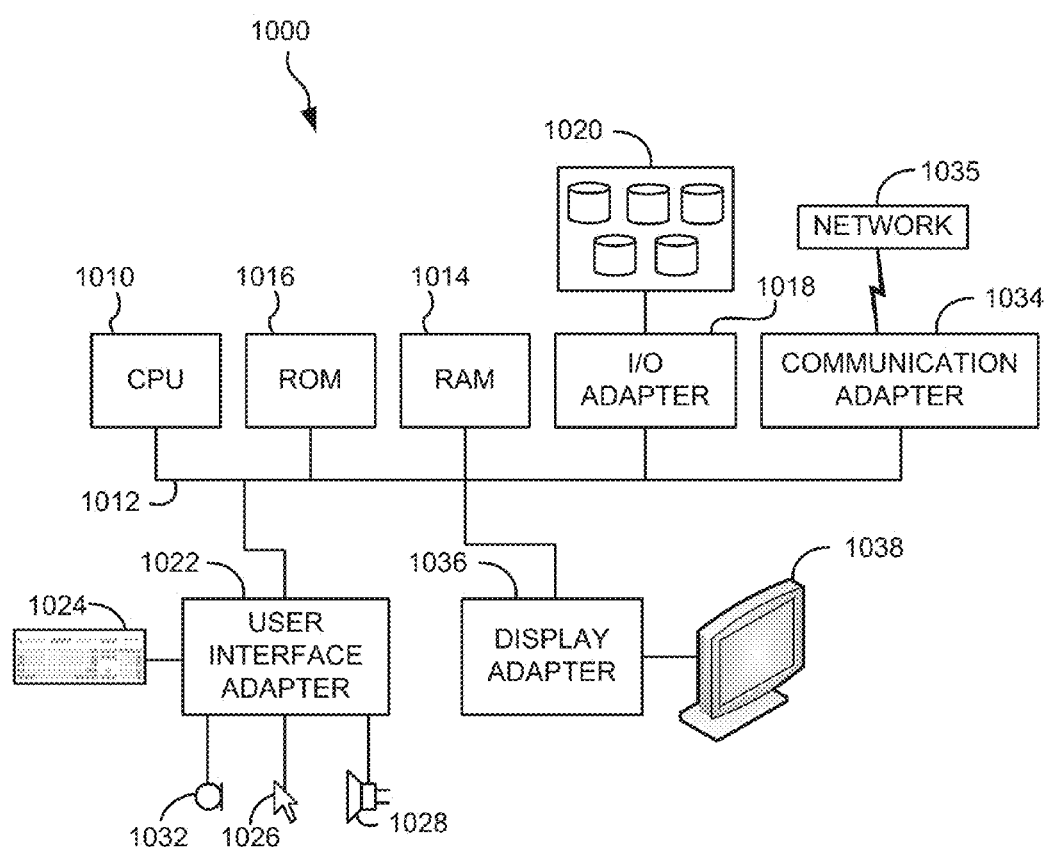
FIG. 10 is a representative hardware environment that may be associated with the servers and/or clients of FIG. 9, in accordance with one embodiment.

FIG. 10 shows a representative hardware environment associated with a user device 916 and/or server 914 of FIG. 9, in accordance with one embodiment. FIG. 10 illustrates a typical hardware configuration of a processor system 1000 having a central processing unit 1010, such as a microprocessor, and a number of other units interconnected via a system bus 1012, according to one embodiment. In some embodiments, central processing unit 1010 may include any of the approaches described above with reference to the one or more processors 210 of FIG. 2.

The processor system 1000 shown in FIG. 10 includes a Random Access Memory (RAM) 1014, Read Only Memory (ROM) 1016, and an I/O adapter 1018. According to some embodiments, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some embodiments, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 11:
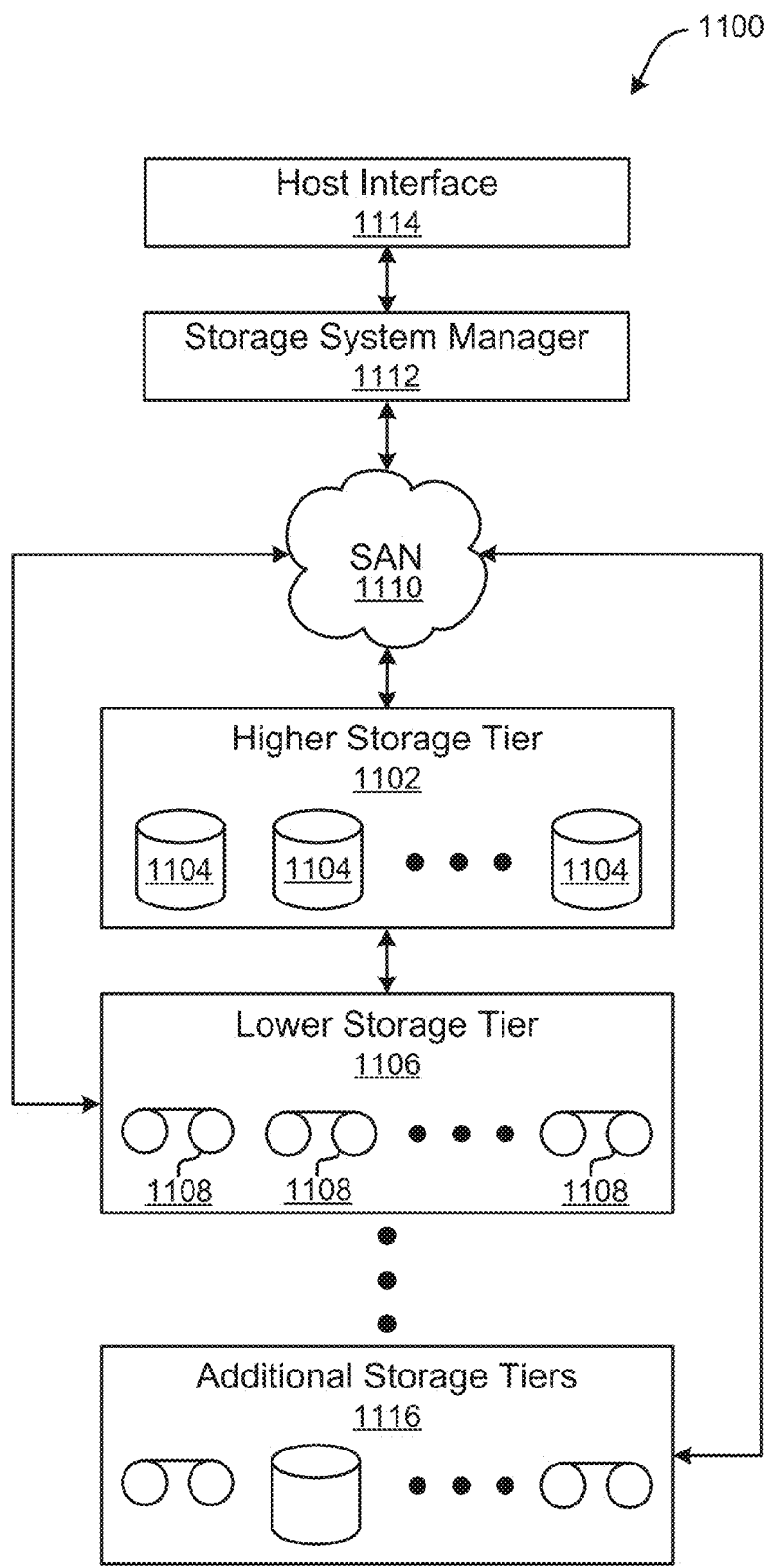
FIG. 11 is a tiered data storage system in accordance with one embodiment.

Moreover, FIG. 11 illustrates a storage system 1100 which implements high level (e.g., SSD) storage tiers in combination with lower level (e.g., magnetic tape) storage tiers, according to one embodiment. Note that some of the elements shown in FIG. 11 may be implemented as hardware and/or software, according to various embodiments. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1102 depending on the desired embodiment.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the embodiments presented herein.

According to some embodiments, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

What is claimed is:

1. A method, comprising:
   repeating the following sequence at least until a page stripe of a memory cache has at least a predetermined amount of data stored therein:
   receiving a compressed logical page of data;
   finding an open codeword having an amount of available space which is greater than or equal to a size of the compressed logical page; and
   storing the compressed logical page in the open codeword having the amount of available space which is greater than or equal to a size of the compressed logical page,
   wherein the compressed logical page does not straddle out of the open codeword.

2. The method of claim 1, wherein an order of compressed logical pages in the open codewords is preserved until the compressed logical pages are written to memory.

3. The method of claim 1, wherein an order of compressed logical pages in the open codewords is dynamically programmed before the compressed logical pages are written to memory.

4. The method of claim 1, comprising incrementing at least one running counter in response to packing the compressed logical page in the open codeword.

5. A system, comprising:
   a write cache;
   a plurality of non-volatile random access memory (NVRAM) blocks configured to store data; and
   a processor and logic integrated with and/or executable by the processor, the logic being configured to:
   pack compressed logical pages of data into open codewords without straddling until a next compressed logical page does not fit into any open codewords;
   determine whether a logical capacity loss is greater than a first threshold; and
   pack the compressed logical page in an open codeword having available space in response to determining that the logical capacity loss is greater than the first threshold,
   wherein the compressed logical page straddles out of the open codeword.

6. The system of claim 5, wherein the logic is configured to increment at least one counter in response to packing the compressed logical page in the open codeword having the greatest amount of available space.

7. The system of claim 5, wherein the logic is configured to pack the compressed logical page in the open codeword having an amount of available space which is greater than or equal to a size of the compressed logical page in response to determining that the amount of available space in any of a plurality of open codewords is greater than or equal to the size of the compressed logical page.

8. The system of claim 5, wherein the logic is configured to write the data corresponding to the compressed logical pages in all open codewords to the non-volatile random access memory in response to determining that the logical capacity loss is not greater than the first threshold.

9. The system of claim 8, wherein the logic is configured to reset at least one running counter in response writing the data to the non-volatile random access memory.

10. The system of claim 5, wherein an order of compressed logical pages in the open codewords is dynamically programmed before the compressed logical pages are written to memory.

11. The system of claim 5, wherein the first threshold is 2% of a logical capacity of a plurality of open codewords.

12. The system of claim 5, wherein the logical capacity loss is calculated in real time.

13. The system of claim 5, wherein no more than two compressed logical pages are buffered at a time.

14. The system of claim 5, wherein an order of compressed logical pages in the open codewords is preserved until the compressed logical pages are written to memory.

15. A computer program product comprising a computer readable storage medium having program instructions embodied therewith, the program instructions readable and/or executable by a controller to cause the controller to:
   receive, by the controller, a compressed logical page of data;
   determine, by the controller, an amount of available space in each of a plurality of open codewords sequentially;
   determine, by the controller, whether the amount of available space in any of the plurality of open codewords is greater than or equal to a size of the compressed logical page;
   pack, by the controller, the compressed logical page in an open codeword having an amount of available space which is greater than or equal to the size of the compressed logical page in response to determining that the amount of available space in any of the plurality of open codewords is greater than or equal to the size of the compressed logical page;
   calculate, by the controller, a logical capacity loss in response to determining that the amount of available space in each of the plurality of open codewords is not greater than or equal to the size of the compressed logical page;
   determine, by the controller, whether the logical capacity loss is greater than a first threshold; and
   write, by the controller, the data corresponding to the compressed logical pages in all open codewords to a non-volatile random access memory in response to determining that the logical capacity loss is not greater than the first threshold.

16. The computer program product of claim 15, wherein the program instructions are readable and/or executable by the controller to cause the controller to:
   pack, by the controller, the compressed logical page in an open codeword having the greatest amount of available space in response to determining that the logical capacity loss is greater than the first threshold,
   wherein the compressed logical page straddles out of the open codeword.

17. The computer program product of claim 15, wherein the first threshold is 2% of a logical capacity of the plurality of open codewords.

18. The computer program product of claim 15, wherein the logical capacity loss is calculated in real time.

19. The computer program product of claim 15, wherein no more than two compressed logical pages are buffered at a time.

20. The computer program product of claim 15, wherein an order of compressed logical pages in the open codewords is preserved until the compressed logical pages are written to memory.

* * * * *